(12) United States Patent
Chang et al.

(10) Patent No.: US 7,695,581 B2
(45) Date of Patent: Apr. 13, 2010

(54) LED REFLECTOR MOLDING PROCESS, CONSTRUCTION, AND LOADER THEREOF

(75) Inventors: Chen-Shing Chang, Pingjhen (TW); Jung-Hsiu Hsieh, Pingjhen (TW); Kuo Hu-Chen, Pingjhen (TW); Min-Li Lee, Pingjhen (TW)

(73) Assignee: Elit Fine Ceramics Co., Ltd., Taoyuan County (TW)

( * ) Notice: Subject to any disclaimer, the term of this patent is extended or adjusted under 35 U.S.C. 154(b) by 339 days.

(21) Appl. No.: 11/707,241

(22) Filed: Feb. 16, 2007

(65) Prior Publication Data

US 2007/0263389 A1 Nov. 15, 2007

(30) Foreign Application Priority Data

Mar. 17, 2006 (TW) ............................... 95109289 A
Sep. 29, 2006 (TW) ............................... 95136209 A

(51) Int. Cl.
*C03B 29/00* (2006.01)
(52) U.S. Cl. ....................... 156/89.11; 264/1.9; 362/341
(58) Field of Classification Search ................. 362/341, 362/349.92, 800; 156/89.11–89.28; 264/1.7, 264/1.9; 438/26
See application file for complete search history.

(56) References Cited

U.S. PATENT DOCUMENTS

| | | | |
|---|---|---|---|
| 6,194,743 B1 * | 2/2001 | Kondoh et al. | 257/94 |
| 6,531,328 B1 * | 3/2003 | Chen | 438/26 |
| 6,707,069 B2 * | 3/2004 | Song et al. | 257/79 |
| 7,095,053 B2 * | 8/2006 | Mazzochette et al. | 257/81 |

* cited by examiner

*Primary Examiner*—Gunyoung T Lee
(74) *Attorney, Agent, or Firm*—Jackson IPG PLLC

(57) ABSTRACT

A light emitting diode reflector molding process, and a construction thereof includes preparation of a first and a second green sheet structures respectively provided with a first and a second open patterns with the porosity of the second open pattern smaller than that of the first open pattern; the second green sheet structure being placed on top of the first green sheet structure to such that both opening patterns being overlapped to each; a metallic layer being coated on the second green sheet structure, the second green sheet structure being molded along the opening pattern of and covering upon the first green sheet for the metallic layer to become the wall of the reflector opening.

12 Claims, 15 Drawing Sheets

US 7,695,581 B2

LED REFLECTOR MOLDING PROCESS, CONSTRUCTION, AND LOADER THEREOF

BACKGROUND OF THE INVENTION (a) Field of the Invention

The present invention is related to a molding process of a light emitting diode (LED) reflector, its construction, and the reflector-applied LED loader, and more particularly, to a molding process of an LED ceramic reflector with variable LED loading angles.

(b) Description of the Prior Art

Light emitting diode (LED) for compact in size, lower power consumption, low heat generation, and long service lift has gradually exited the conventional tungsten lamp of the similar function as found in Xmas light, flashlight, vehicle signal light, and traffic mark. An LED is essentially comprised of a transparent package containing conductive terminals of different polarities and a loader; a chip is disposed on the load; an electrode layer of the chip and those conductive terminals are connected to each other by means of a gold plated wire; and each conductive terminal extends out of the transparent package to become a contact to a power source.

A chemical compound semi-conductor in the LED chip essentially decides spectrum or luminance characteristics of the LED. Optical characteristics of the LED including light emitting luminance or angle of filed of view are significantly subject to package substrate of the LED.

In a construction of an LED of the prior art, a reflector operates to reflect light emitted by the LED. Generally, the reflector is provided using the drilling, punching or laminating method. However, any of these methods is blamed for higher cost, rough inclined plane being detrimental to the pattern of light reflection, opening shape being limited, and prevention from producing packed circuits. As a result, efforts for reducing packaging cost of the LED and for improving the light selection efficiency of the LED are frustrated.

Furthermore, packaging construction and performance of the LED are closely related. Whether a heat generated in the course of chip operation can be rapidly released to the ambient or to a heat dissipation mechanism becomes one of those factors in determination of the LED performance. Wherein, one of the mainstreams in the packaging development involves direct loading of the chip on a metal admixture of high heat transfer coefficient. Generally, in case of a ceramic metal package construction, a metal material and a ceramic material must be sintered together. However, if the metal admixture does not contract in the sintering process, a comparatively expensive non-contractible ceramic material must be used. Manual soldering is required in the assembly of the LED module since in multiple designs those electrodes in an LED are confined to where above a substrate to warrant improvement its workability.

SUMMARY OF THE INVENTION

The primary purpose of the present invention is to provide an LED reflector molding process to solve the problem of difficult shaping of the reflector as found with the prior art. The molding process of the present invention for an LED reflector involves the formation of a metallic layer, a printed reflective silver layer inter alia, on a green sheet structure by using a thick film printing method to substitute a film coating technology used in the prior art while upgrading light selection efficiency of the LED; a hot laminating method is employed to the reflector essentially comprised of a ceramic green sheet for the production of a reflector with its opening shape and angle meeting design requirements of the LED light emitting shape.

To achieve the purpose, a first green sheet and a second green sheet are prepared with both sheets respectively provided with a first opening pattern and a second opening pattern. Wherein, the porosity of the second opening pattern is smaller than that of the first opening pattern. The second green sheet structure is placed on the first green sheet structure to locate the second opening pattern on the first opening pattern to overlap both patterns. The second green sheet structure is coated with a metallic layer. Finally, the second green sheet structure is molded and covers upon the first green sheet structure along the opening patter of the first green sheet structure.

Another purpose of the present invention is to provide a construction of the LED reflector essentially having the circuit connection between the reflector and electrodes of a ceramic base as the primary structure; a metallic admixture is fixed to the ceramic base by hard soldering, high polymer adhesive or glass sealing; a metallic admixture and a ceramic of approximate heat expansion coefficient are selected for combination to reduce heat stress.

DETAILED DESCRIPTION OF THE PREFERRED EMBODIMENTS

Figure 1:
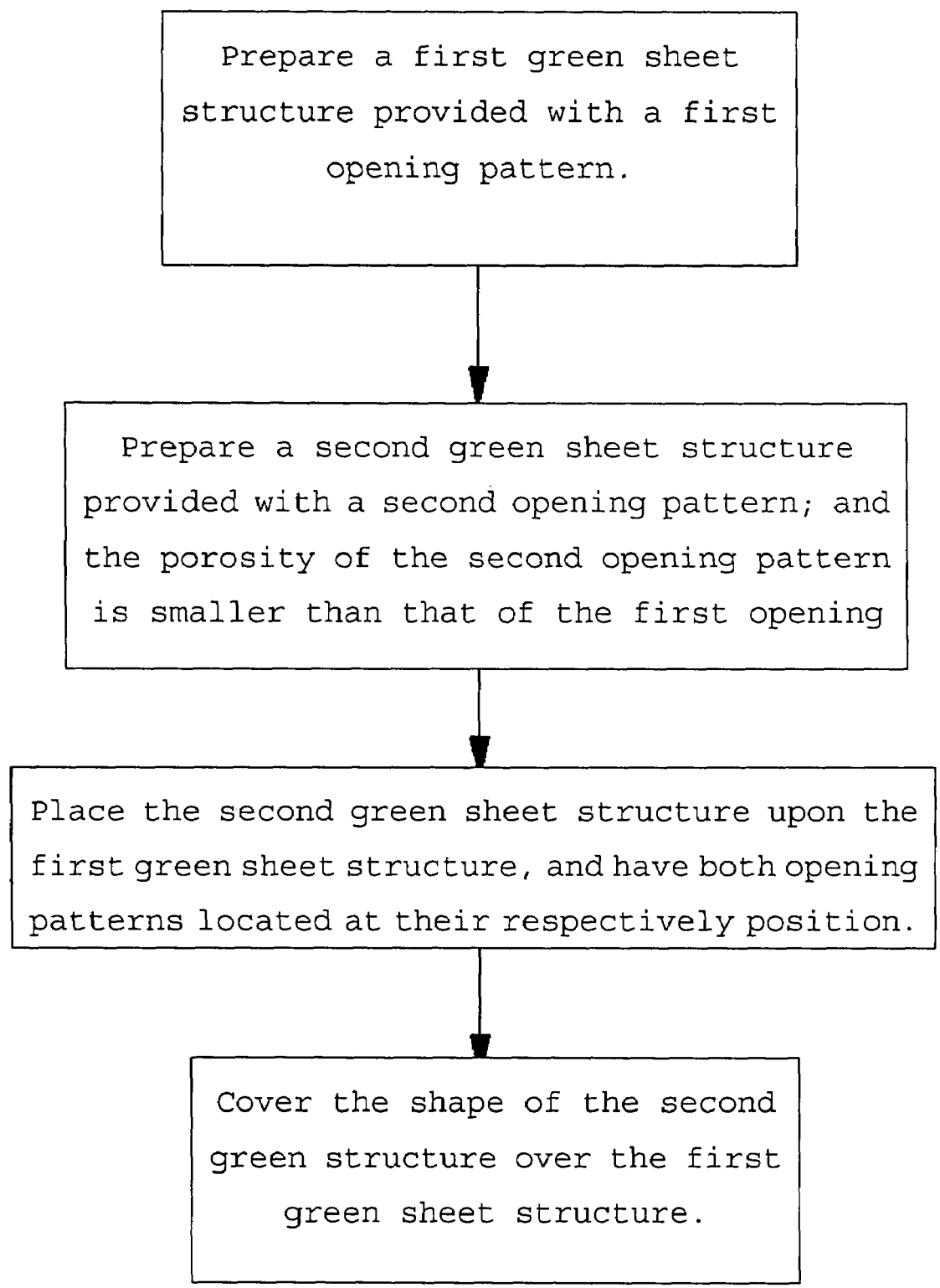
FIG. 1 is a flow chart showing an LED molding process of the present invention.
Figure 2:
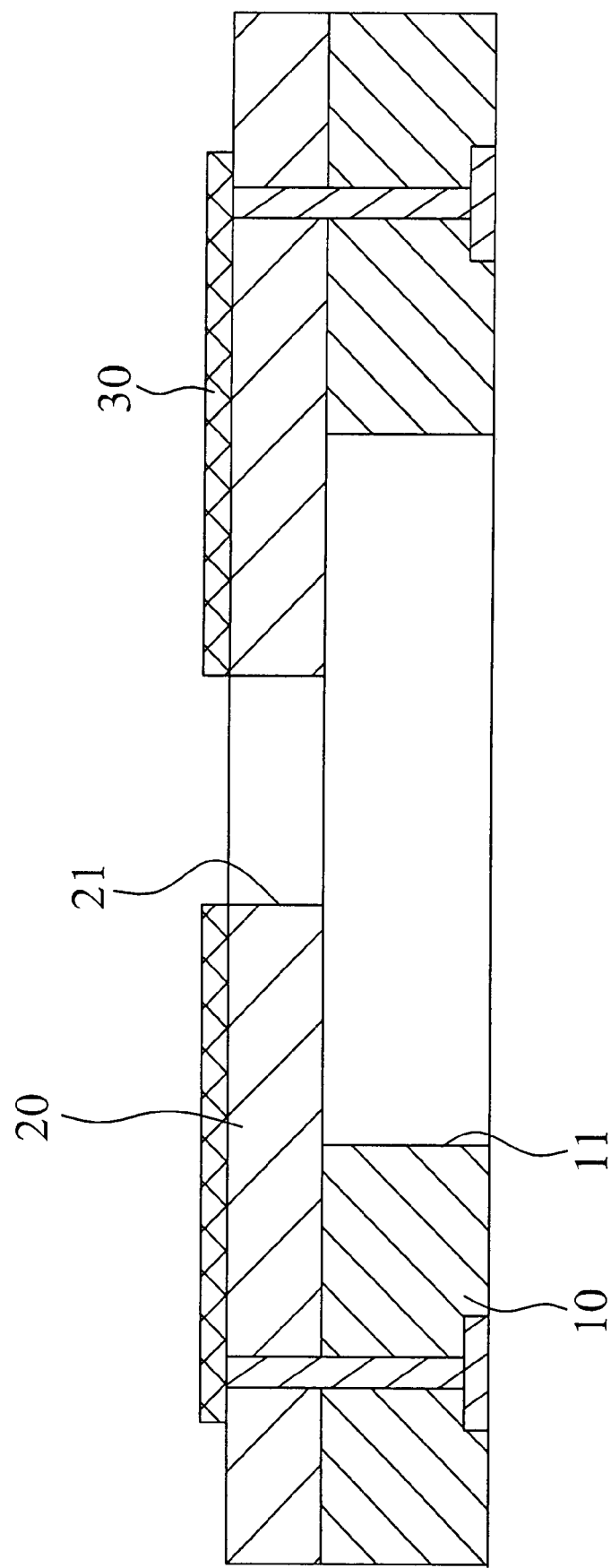
FIG. 2 is a sectional view showing a reflector material structure of a preferred embodiment of the present invention.
Figure 3:
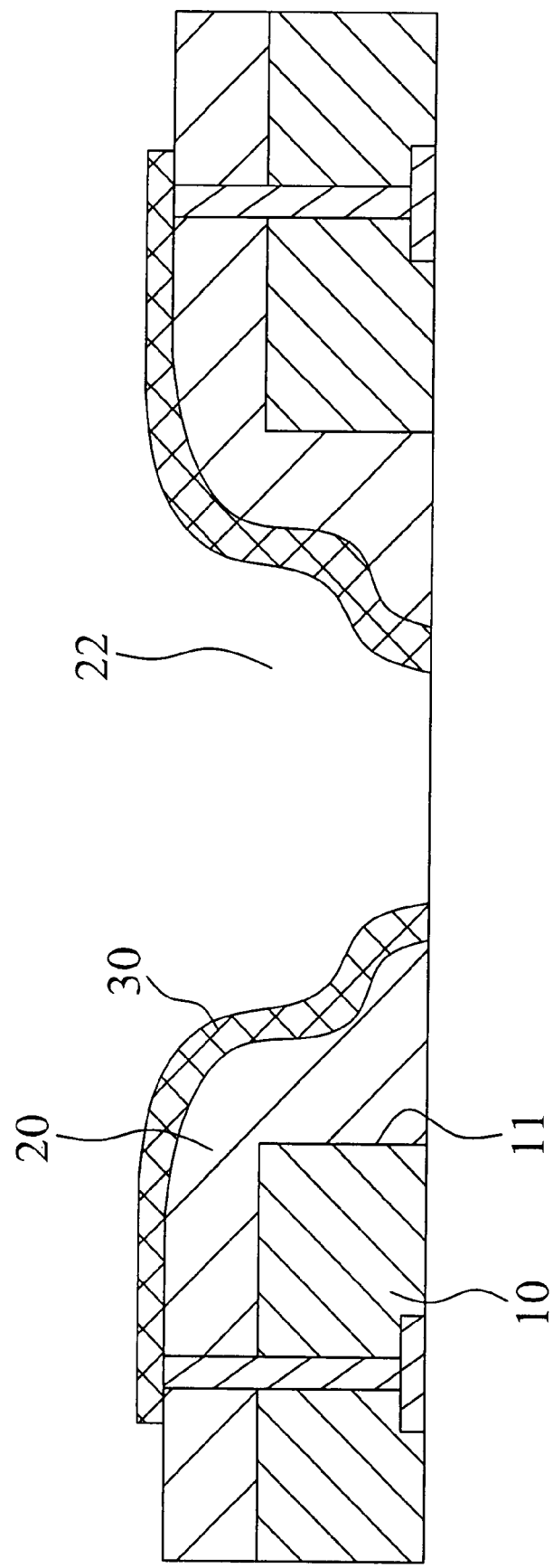
FIG. 3 is a sectional view showing a molded structure of the LED of the present invention.

The present invention is related to a light emitting diode (LED) reflector molding process, a reflector construction and a loader. As illustrated in FIG. 1, an LED reflector molding process includes multiple steps. Step 1 involves preparation of a first green sheet structure provided with a first opening patter; a second green sheet structure provided with a second opening pattern in porosity smaller than the first opening patter of the first green sheet structure is prepared, and the first opening pattern is placed on top of the first green sheet structure to overlap with the first opening pattern in Step 2; a metallic layer is placed on top of the second green sheet structure in Step 3; and in Step 4 the second green sheet structure is molded and covers upon the first green sheet structure along the first opening pattern of the first green sheet structure. In a preferred embodiment of the preset invention as illustrated in FIG. 2, a reflector material structure includes a first green sheet structure 10 and a second green sheet structure 20 with each comprised of a pack of ceramic green structure. A first opening pattern 11 and a second opening pattern 21 are respectively provided to the first and the second green sheet structures 10 and 20 with porosity of the second opening pattern 21 smaller than that of the first opening pattern 11 while the second green sheet structure 20 is placed on the first green sheet structure 10 for the second opening pattern 21 to overlap with the first opening pattern 11. A metallic layer 30 is disposed to the second green sheet structure 20 at wherein in relation to the first opening pattern 11. Both of the first and the second green sheet structures 10 and 20 are thermally molded or laminated to each other to such that the metallic layer 30 to respectively become a sidewall and a base of the first opening pattern 11 as illustrated in FIG. 3. Upon both of the first and the second green sheet structures 10 and 20 are bound to each other, the second green sheet structure 20 covers on top of the first green sheet structure 10 by following the form of the first green sheet structure 10 and defines a loading concave 22 molded along the first opening pattern 11 while the metallic layer 30 is disposed at where in relation to a sidewall and a base of the loading concave 22 to provide a reflective sidewall.

The metallic layer 30 is coated on a surface of the second green sheet structure 20. In the preferred embodiment, a thick film printing method is employed to coat a silver layer on certain area of the surface; or alternatively both of the first and the second green sheet structures are sintered together to form a conductive or reflective layer, and an electrode plating method is employed to provide a plated layer on the metallic layer disposed on the surface of the second green sheet structure to increase reflection efficiency.

Figure 4:
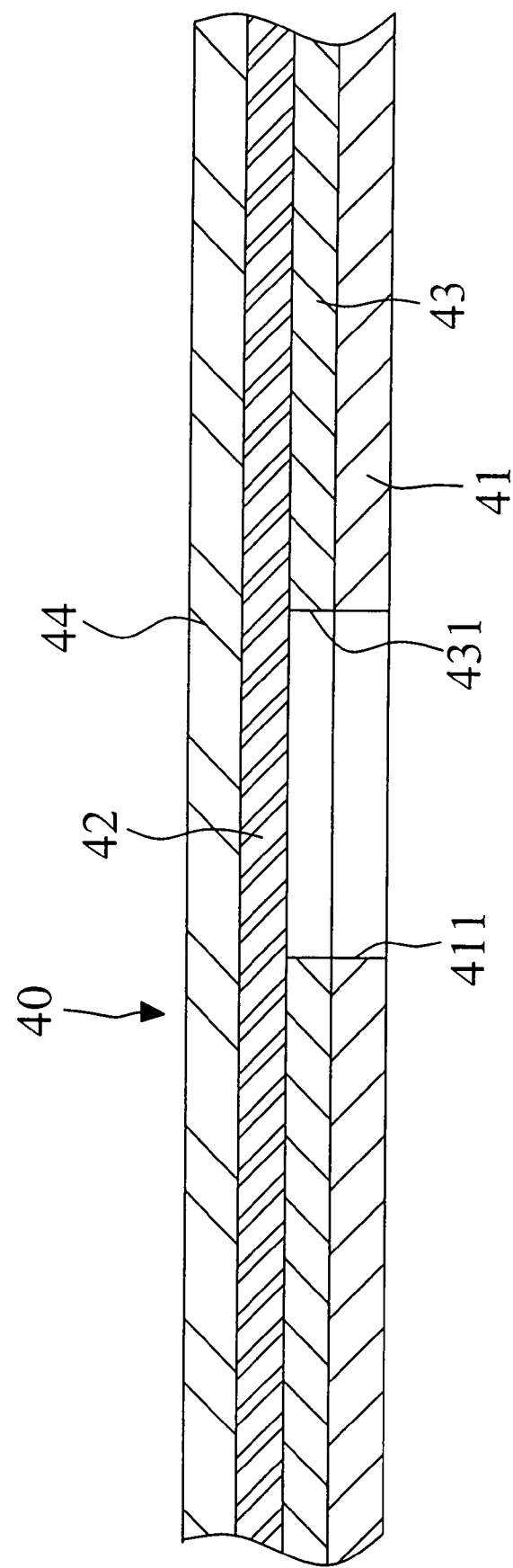
FIG. 4 is a sectional view showing a molding structure of the present invention.

Wherein, in the thermal molding or the laminating method is employed as shown in the preferred embodiment, a molding structure is heat pressed on the second green sheet structure. As illustrated in FIG. 4 for another preferred embodiment of the present invention, a molding structure 40 includes a flat layer 43 disposed at where between a first release film 41 and a second release film 42, and a buffer layer 44 disposed on the second release film 42. Wherein both the first and the second release films 41 and 42 are made of polyester film; and the first release film 41 contacting the metallic layer 30 and the second green sheet structure 20 is provided with a fourth opening pattern 411 for use in molding and post-stripping in porosity equal to or different from that of the first opening pattern. The fourth opening pattern 411 is overlapped with the first opening pattern 11. The flat layer 43 is related to a hard plate material providing hardness, strength or rigidity higher than that of the first release film 41 or the second release film 42 so that in the molding process, the reflective plan of the reflector is flushed with the base while compressing flushed the reflector material structure. The flat layer 43 is provided with a fifth opening pattern 431 in porosity equal to or different from that of the first opening pattern. Furthermore the second release film 42 relates to a film without opening pattern and of a thickness or material different from that of the first release film 41 for molding purpose. The buffer layer 44 is related to an epoxy layer to help sustain pressure.

Figure 5:
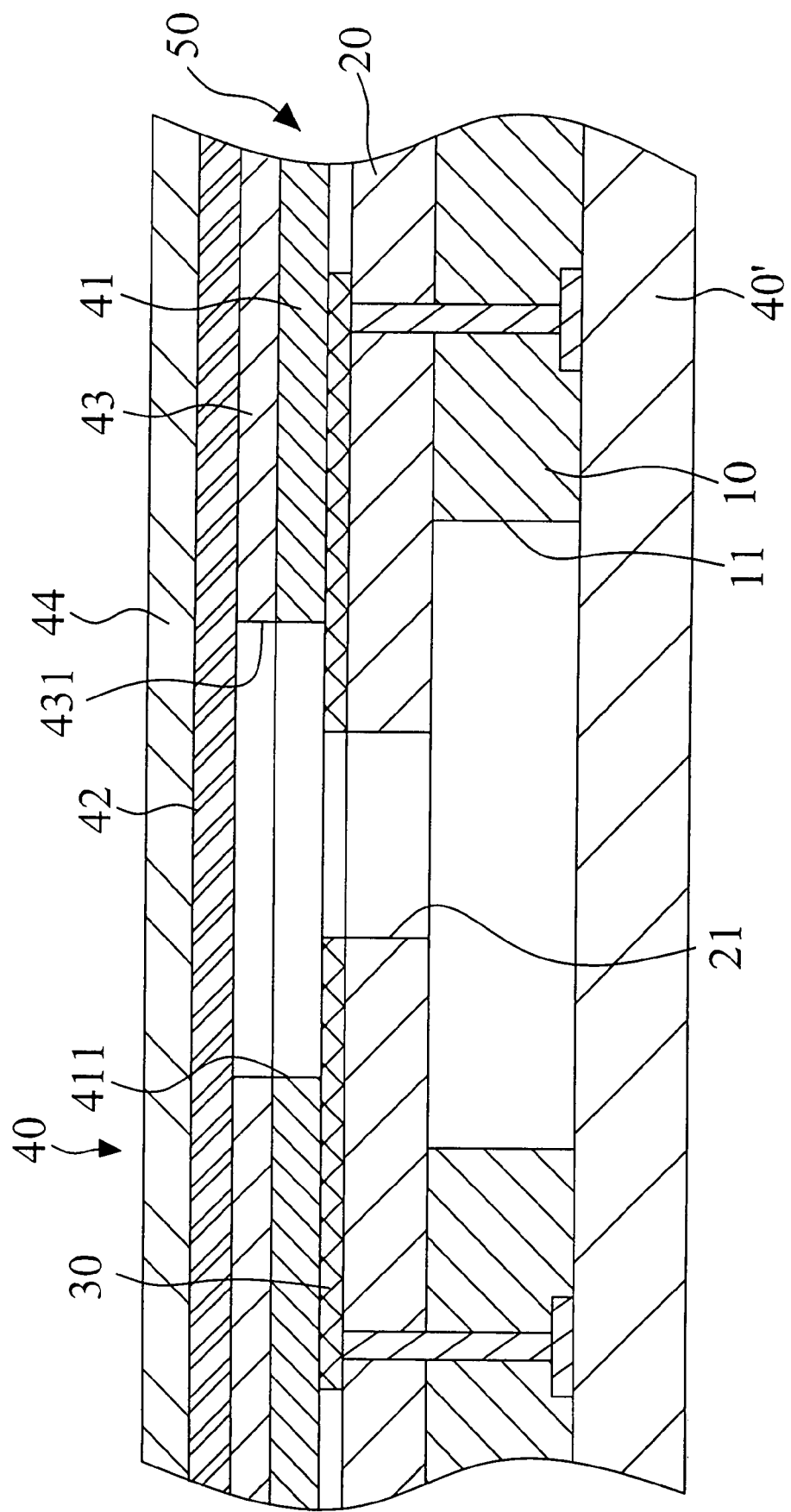
FIG. 5 is a sectional view showing a pack of a reflector material structure and the molding structure of the present invention.
Figure 6:
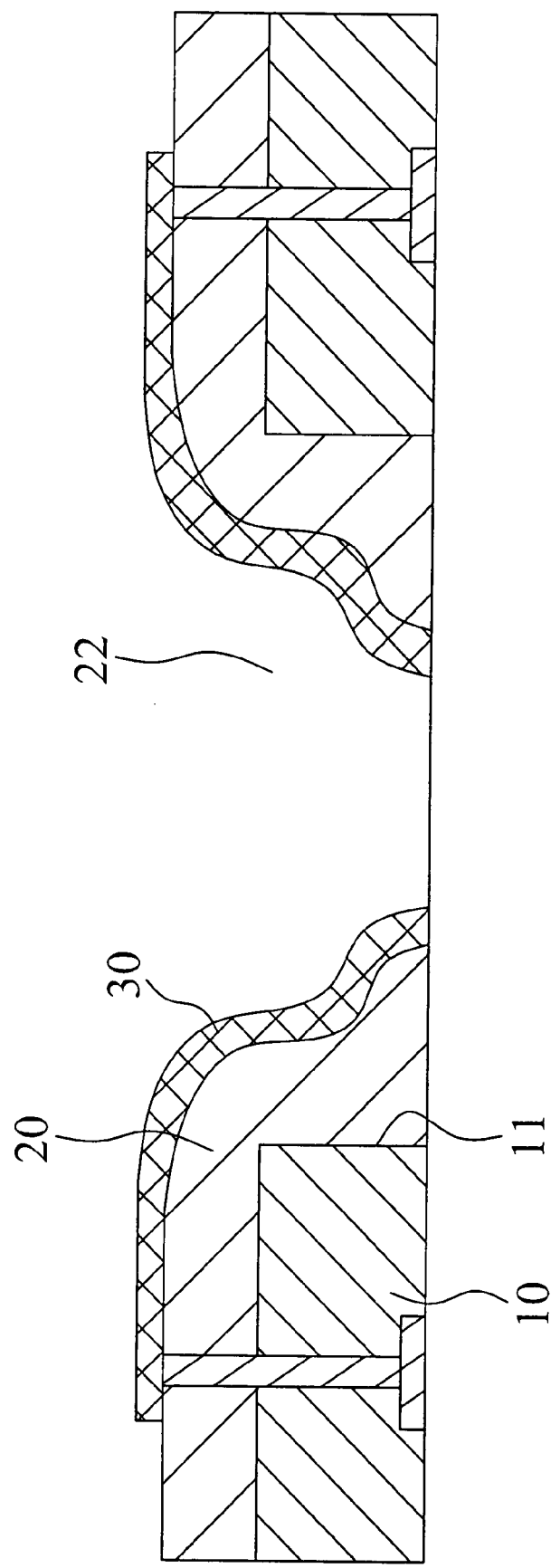
FIG. 6 is a sectional view of the reflector of the present invention.

In another preferred embodiment yet of the present invention as illustrated in FIG. 5, the first and the second green sheet structures 10 and 20 of the reflector material structure are disposed at where between the molding structure 40 and another molding structure 40'. To pack, multiple layers including a buffer layer and a flat layer of the molding structure 40' are fixed to a locating pin or a pin position in sequence; followed by the first and the second green sheet structures also secured to the locating pin or the pin position, wherein a metallic layer has been already formed; and finally those multiple layers of another molding structure are placed on the top of the second green sheet structure and secured in place to become a pack 50. The entire pack structure 50 wrapped up on a blistered bag (not illustrated) is given a hot isostatic pres process (HIP). During the HIP process, the second green sheet structure and the metallic layer gradually collapse in the direction of the molding structure to form the opening shape and angle needed by the reflector; meanwhile, a shape between the sidewall of the reflector and the edge of the opening is molded to complete the molding of the reflector. As illustrated in FIG. 6, a base layer is related to a first ceramic structure 10' provided with a first opening pattern 111 and a formation layer relates to a second ceramic structure 20' provided with a second opening pattern 21' in porosity smaller than that of the first opening pattern 11'; the second ceramic structure 20' is placed on top of the first ceramic structure 10' and is molded along the first opening patter 11'. A metallic layer 30' is disposed on the second ceramic structure 20'.

Figure 7A:
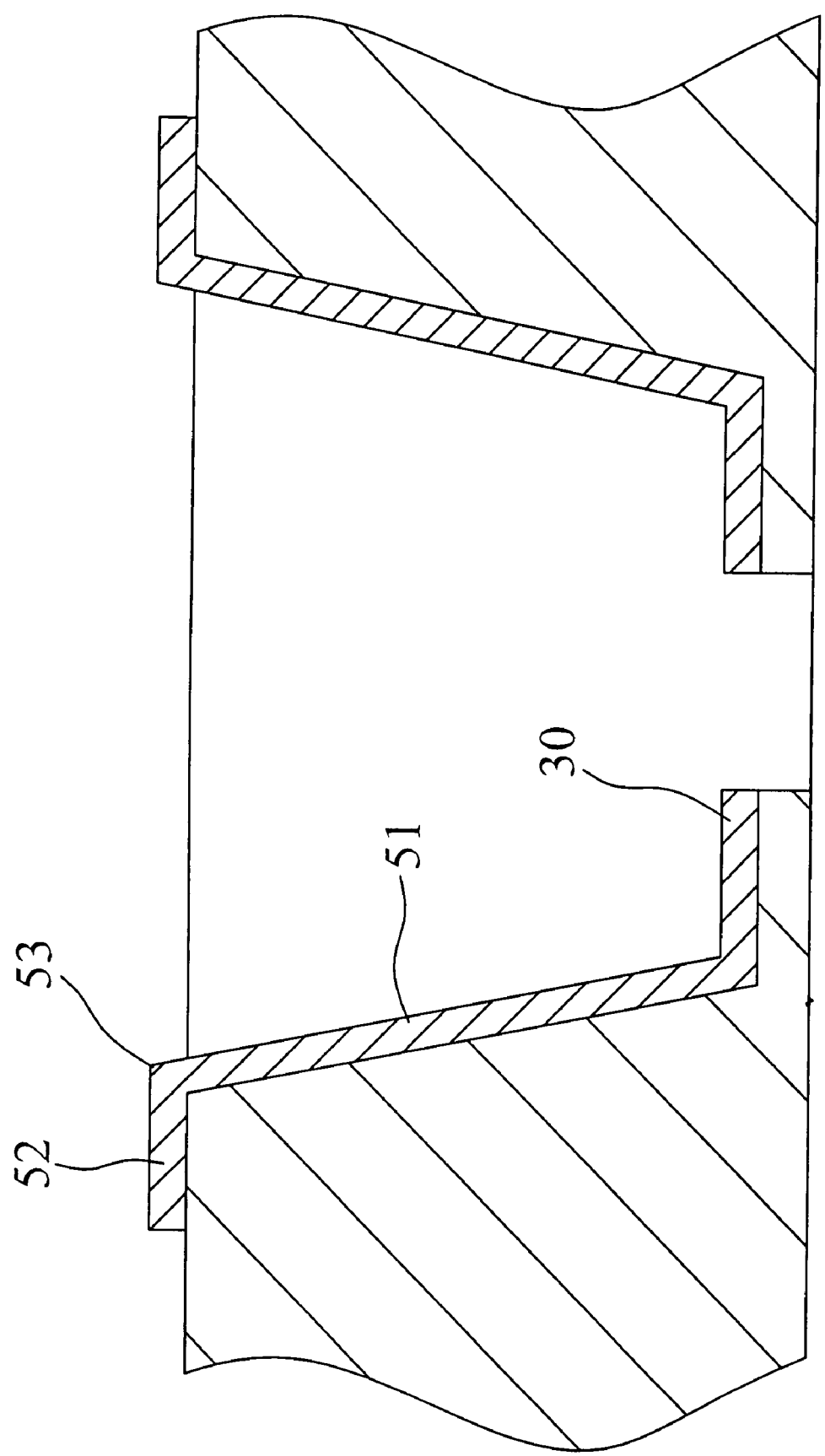
FIGS. 7(A), 7(B), and 7(C) are sectional views showing various fixed slopes of the inner wall of the reflector of the present invention.
Figure 7B:
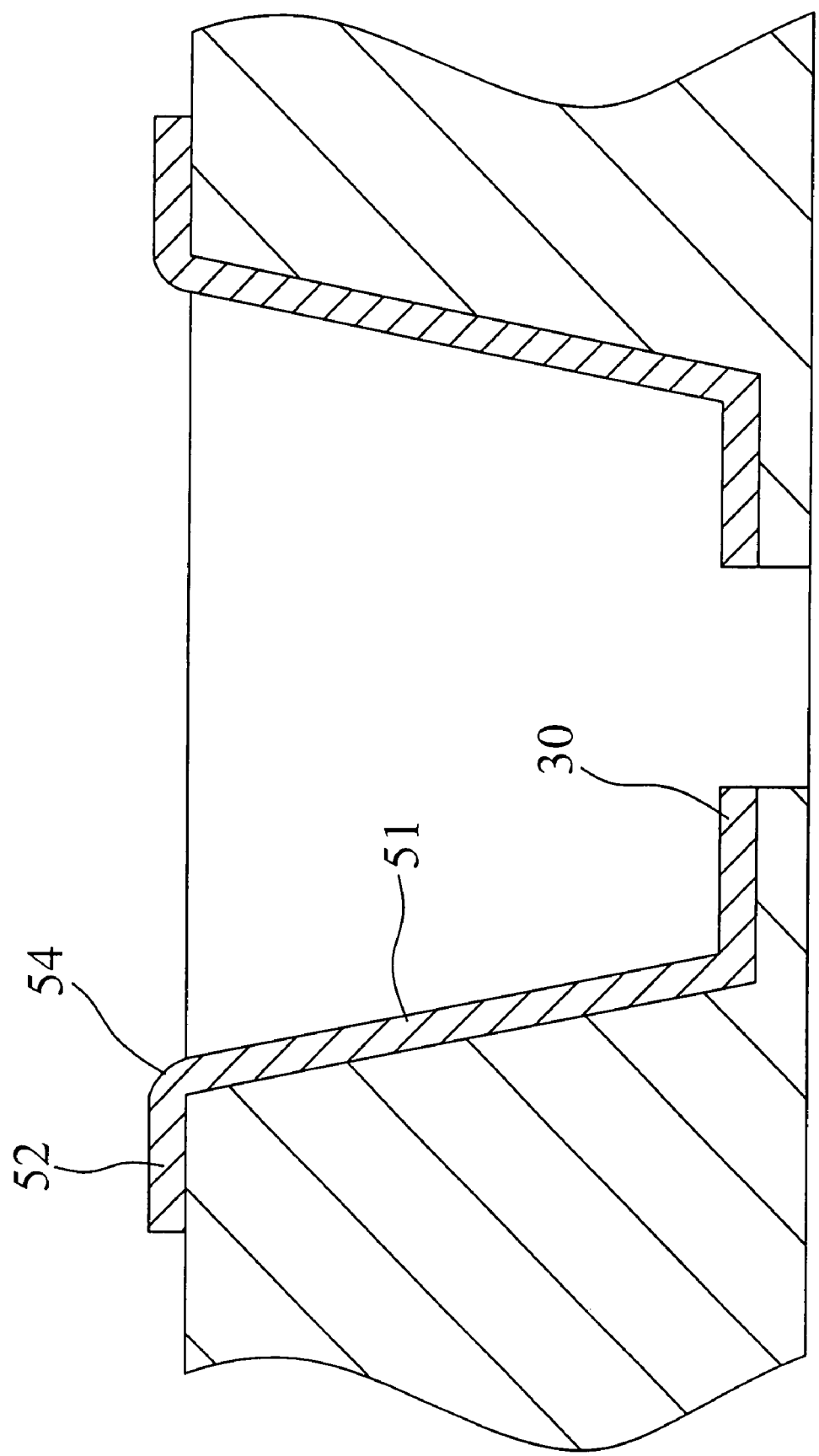
Figure 7C:
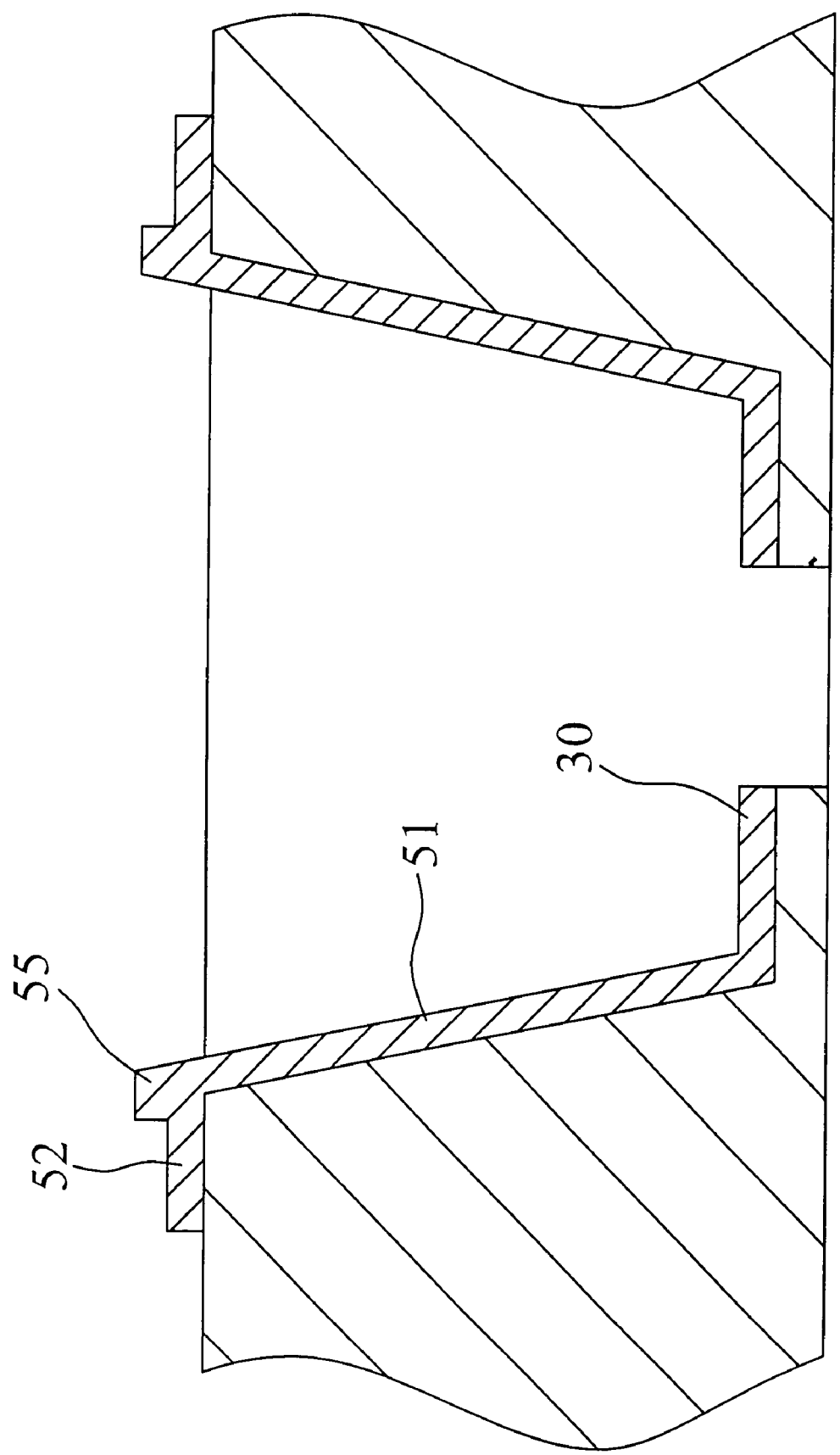
Figure 8A:
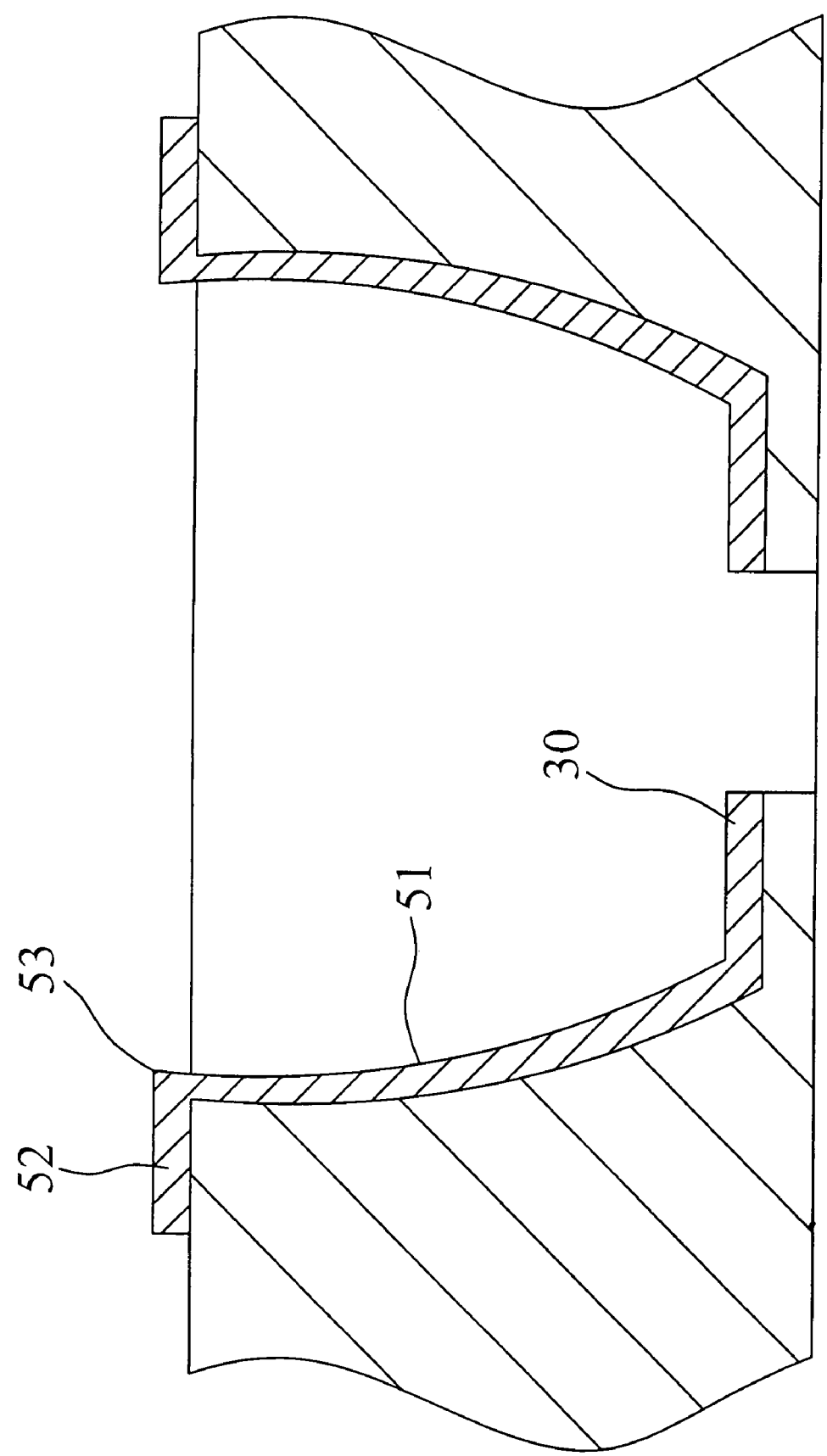
FIGS. 8(A), 8(B), and 8(C) are sectional view showing various curvatures of the inner wall of the reflector of the present invention.
Figure 8B:
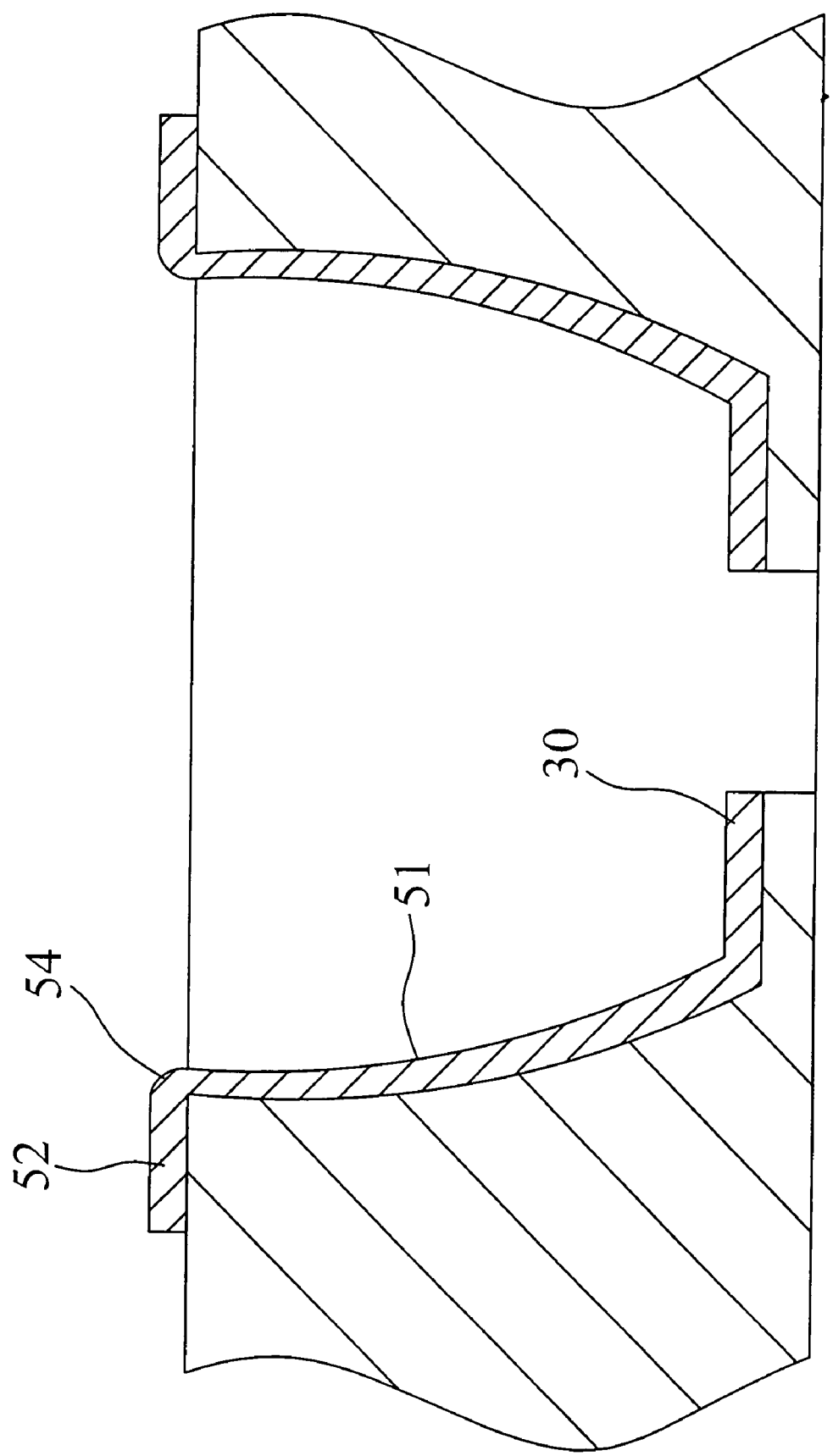
Figure 8C:
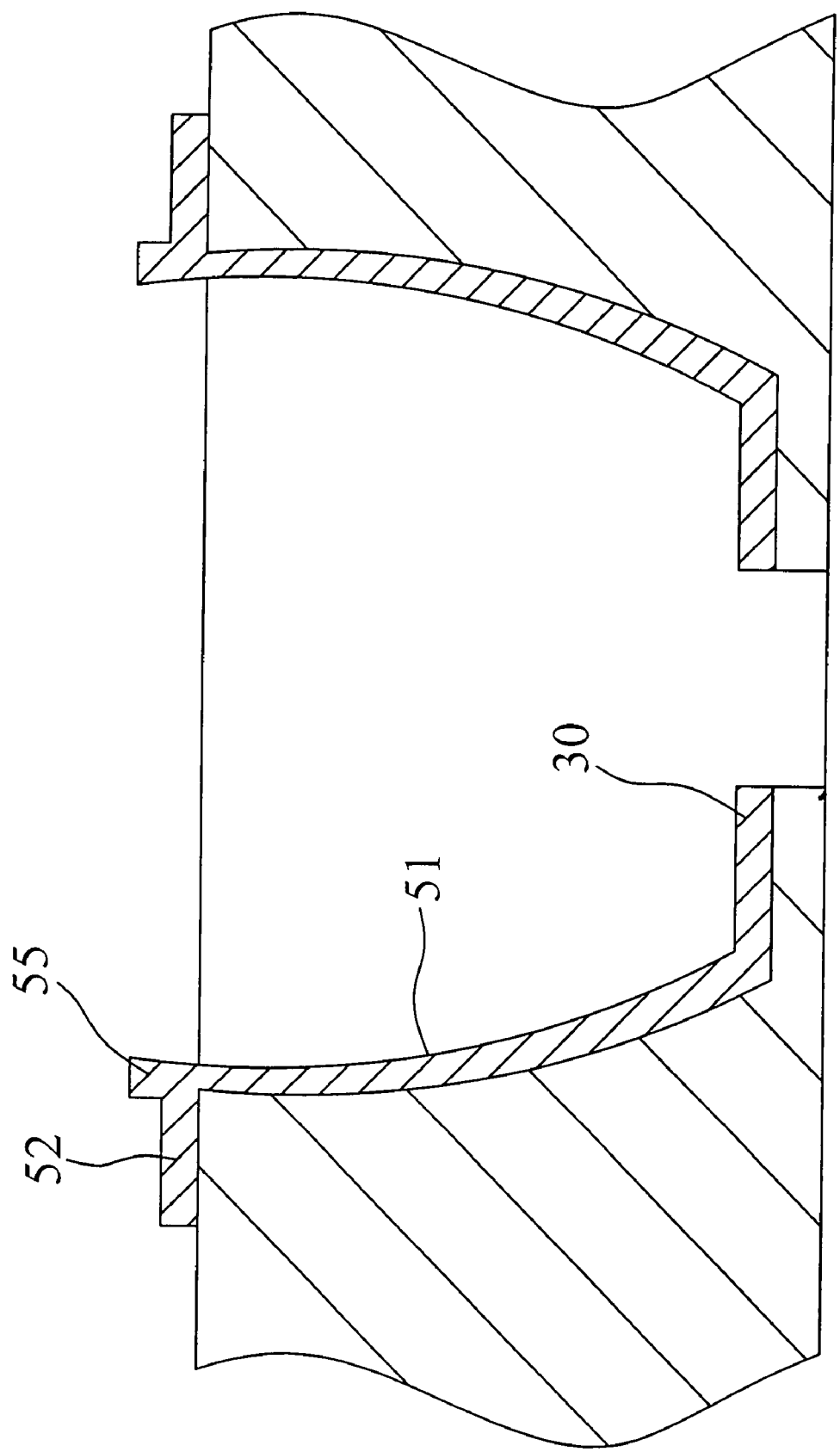
Figure 9:
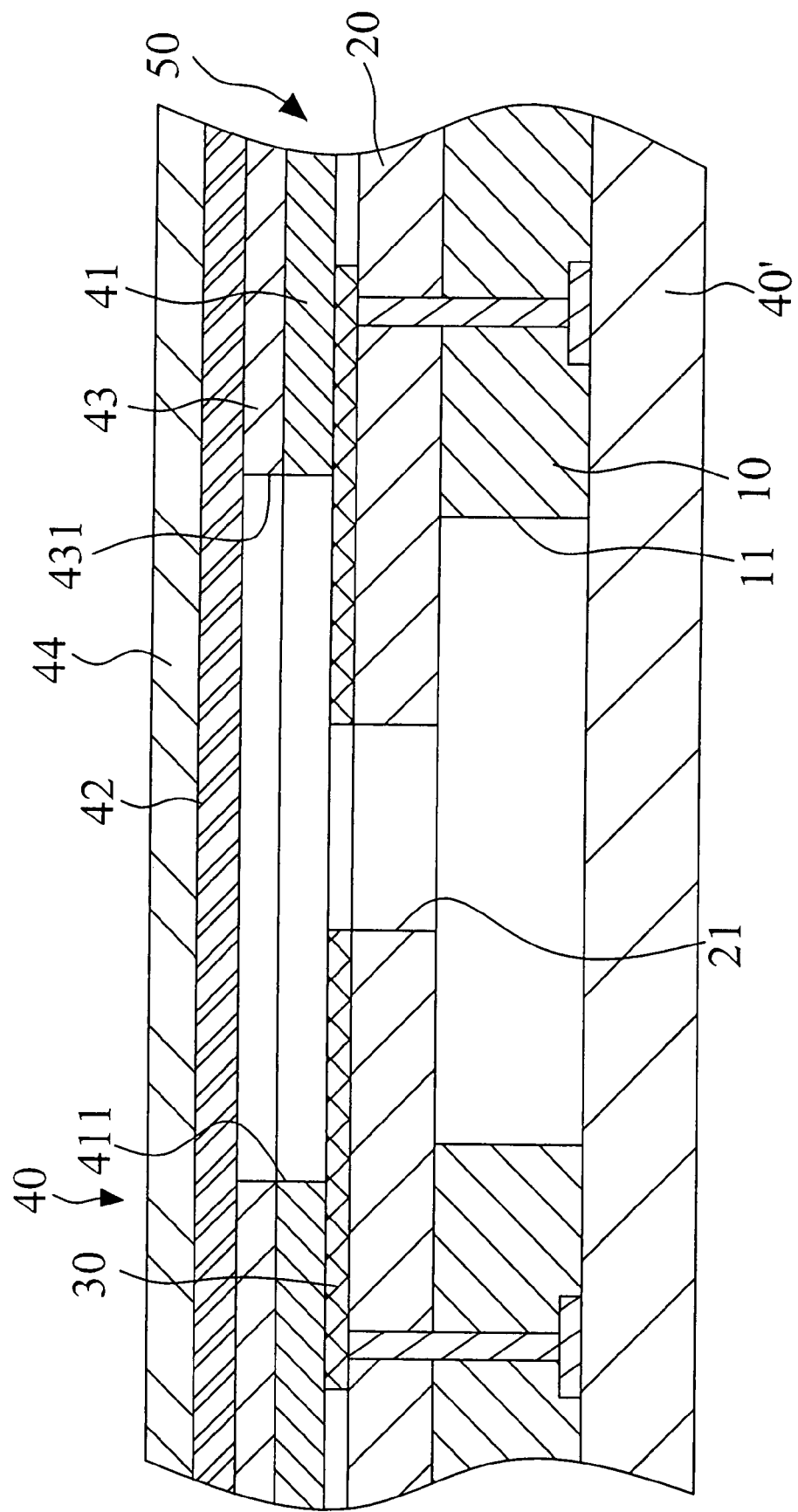
FIG. 9 is another sectional view showing the pack of the reflector material and the molding structure of the present invention.

The shape formed between the sidewall of the reflector and the edge of the opening may vary depending on the size of the porosity each of a fourth and a fifth opening patters respectively of the first release film and the flat layer in the molding structure and if each porosity of the fourth and the fifth opening patterns is the same as or different from the porosity of the first opening pattern. As illustrated in FIGS. (A) through FIG. (C) for sectional views of the geometric forms of the reflector in another preferred embodiment yet of the present invention, a sidewall 51 of the reflector as illustrated in FIGS. 9(A), 9(B), and 9(C) is related to a reflective metallic layer with a given slope; or to a metallic reflector with a curvature as illustrated in FIGS. 8(A), 8(B), and 8(C); and where the edge of the opening crosses a plane of the reflector 52 is related to a general included angle 53 as illustrated in FIGS. 7(A) and 8(A), to an arc 54 as illustrated in FIGS. 7(B) and 8(B), or to a retaining ring 55 to prevent overflowing of epoxy as illustrated in FIGS. 7(C) and 8(C). As also illustrated in FIG. 9, the retaining ring 55 is formed by having greater porosities respectively of the fourth and the fifth opening patterns 411 and 431 than the porosity of the first opening pattern 11 so that a structure of the retaining ring 55 is molded in the HIP process. The presence of the retaining ring 55 corrects the problem of overflowing epoxy in the course of LED potting.

Figure 10:
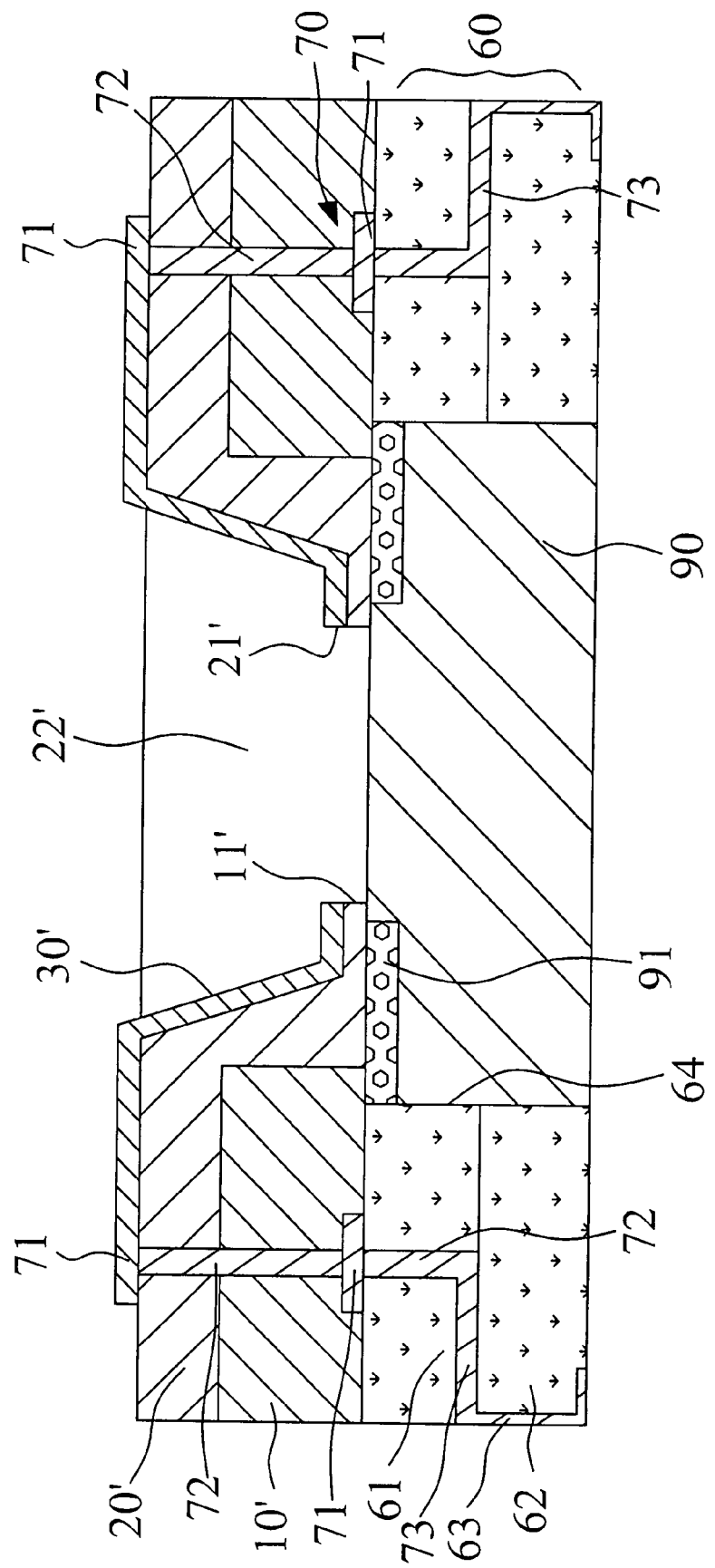
FIG. 10 is a sectional view showing a loader of the present invention.

Now referring to FIG. 10 for a loader of LED, the loader includes the first ceramic structure 10' and the second ceramic structure 20' respectively provided with the first and the second opening patterns 11' and 21' with the porosity of the second opening pattern 21' smaller than that of the first opening pattern 11'. The second opening pattern 21' covers up on the first ceramic structure 10' by following the shape of the first opening pattern 11' to define a loading concave 22' provided on its inner side a metallic layer 30'. A ceramic base 60 disposed on the bottom of the first ceramic structure 10' contains a first ceramic and a second ceramic layers 61 and 62 overlapped to each other. An electrode structure 63 is disposed on a surface of the second ceramic layer 62, and an electrode connection circuit 70 provides electric connection between the metallic layer 30' and the electrode structure 63. The electrode connection circuit 70 located on the first ceramic structure 10', the second ceramic structure 20', and/or the ceramic base 60 include conductive connection pad, embedded circuit, and/or conductive hole. As illustrated, two conductive connection pads 71 are respectively distributed on the top of the first ceramic structure 10' to contact the metallic layer 30' and on the bottom of the second ceramic structure 20' while both conductive connection pads 71 are connected to each other through a conductive hole 72. The conductive hole 72 as illustrated penetrates through where between the first and the second ceramic structures 10' and 20', or is disposed on each outer surface of the first and the second ceramic structures 10' and 20'. An embedded circuit 73 is disposed to the first and the second ceramic layers 61 and 62 with one end connected to the electrode structure 63 and another end electrically connected to the conductive connection pad 71 of the second ceramic structure 20' by means of the conductive hole 72.

Figure 11:
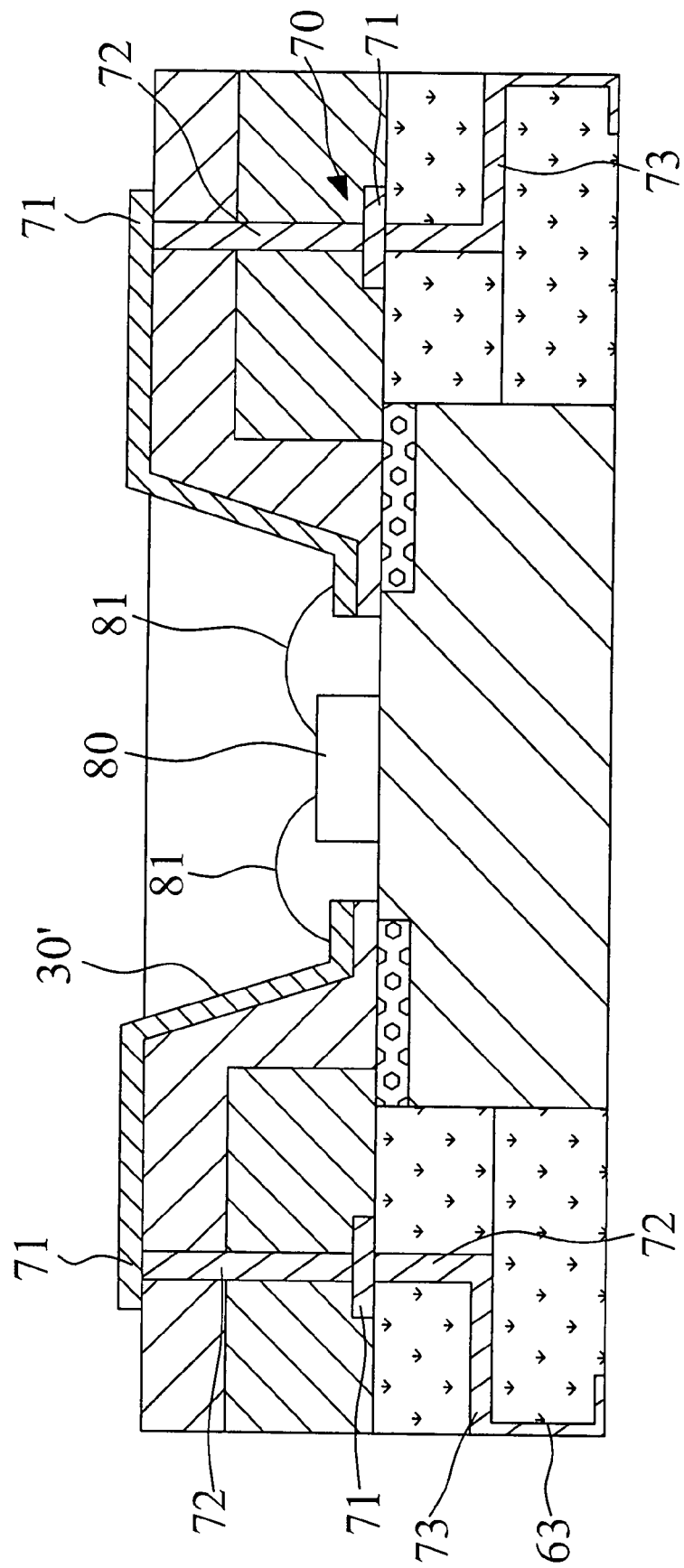
FIG. 11 is a schematic view showing an operation status of the loader of the present invention.

When a light-emitting chip 80 is placed in the loader as, illustrated in FIG. 11, a soldering wire 81 of the chip 80 is soldered to the metallic layer 30' and runs in sequence through the conductive connection pad 71, the conductive hole 72, and another conductive connection pad 71 to the top of the ceramic base 60; and further runs in sequence through the conductive connection pad 71, the conductive hole 72, and the electrode structure 63 to complete an electric connection to facilitate securing the electrode structure to a substrate while providing electric connection between the loader and the substrate.

A third opening 64 is provided to the ceramic base 60 as illustrated in FIG. 10 and overlapped with the loading concave 22'. A metallic admixture 90 is disposed in the third opening 64 and adhered to the ceramic base 60 by means of hard soldering, high polymer adhesive or glass sealing technique. Accordingly, one side of the metallic admixture 90 is exposed to the loading concave 22' while the other side is exposed to the second ceramic layer 62. In the preferred embodiment, the metallic admixture 90 relates to a solid structure made of a material with high heat transfer capacity, and a metallic material having a heat transfer coefficient approximate to that of the ceramic base 60 is preferred, e.g., Cu—W, Cu—Mo, Al—C, metallic wrappage, or Fe—Ni—Co alloy to reduce heat stress generated upon binding the metallic admixture to the ceramic base 60. A solder 91 formed on the surface of the first ceramic layer 61 or on the surface of the metallic admixture 90 exposed in the third opening 64 in another preferred embodiment yet relates to a metallic solder 91, which may be selected from a silver series with a working temperature between 500° C.~800° C., a gold series with a working temperature between 270° C.~500° C., a tin paste with a working temperature between 200° C.~350° C., a glass solder, high polymer adhesive or other solder with a working temperature of 300° C.~600° C., or another solder with an even higher working temperature range. In soldering, jigs for both of the ceramic structure and the metallic admixture are pressurized and secured in position to perform the soldering in a vacuum oven, sintering over, nitrogen mixed gas sintering oven, or atmosphere sintering oven by taking advantage that the metallic layer is capable of rapid transferring heat source generated in the operation of the LED chip.

The prevent invention provides a molding process for an LED reflector, its construction, and a loader by applying the reflector, and the application for a patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. A light emitting diode reflector molding process includes a first green sheet structure provided with a first opening pattern; a second green sheet structure provided with a second opening pattern, porosity of the second opening pattern being smaller than a porosity of the first opening pattern, the second green sheet structure being placed upon the first green sheet structure, and both of the first opening pattern and the second opening pattern being overlapped to each other; a metallic layer being disposed on the second green sheet structure; and the second green sheet structure being molded and covering upon the first green sheet structure along the opening pattern of the first green sheet structure, wherein the second green sheet structure is molded along the opening pattern of the first green sheet structure using a thermal molding or laminating method, wherein a molding structure is used in the thermal molding or hot laminating method to be hot laminated to the second green sheet structure; the molding structure includes a flat layer disposed between a first and a second release films and a buffer layer disposed to the second release film; and the first release film contacts the metallic layer and the second release film.

2. The light emitting diode reflector molding process as claimed in claim 1, wherein each of the first and the second green sheet structure is comprised of a pack of ceramic green sheet.

3. The light emitting diode reflector molding process as claimed in claim 1, wherein a fourth and a fifth opening patterns are respectively provided to the first release film and the flat layer with the porosity of each of the fourth and the fifth opening patterns same as or different from that of the first opening pattern; and the shape formed between the sidewall of the reflector and the edge of the opening also varies.

4. The light emitting diode reflector molding process as claimed in claim 3, wherein the porosity each of the second and the third opening patterns is greater than that of the first opening pattern; and a retaining ring to stop overflow of the epoxy in the course of molding is formed.

5. The light emitting diode reflector molding process as claimed in claim 1, wherein the metallic layer related to a silver layer disposed to the second green sheet structure by using a coating or thick film printing method.

6. The light emitting diode reflector molding process as claimed in claim 1, wherein an electrode connection circuit is provided to the first and the second green sheet structure with one side of the electrode connection circuit being connected to the metallic layer.

7. The light emitting diode reflector molding process as claimed in claim 1, wherein a base is further disposed to one side of the first green sheet structure.

8. The light emitting diode reflector molding process as claimed in claim 7, wherein the base is related to a ceramic base.

9. The light emitting diode reflector molding process as claimed in claim 8, wherein an electrode structure is provided on the surface of the base and is connected to the metallic layer by means of an electrode connection circuit.

10. The light emitting diode reflector molding process as claimed in claim 7, wherein the electrode connection circuit includes an embedded circuit and/or a conductive hole located on the first green sheet structure, the second green sheet structure, or the base.

11. The light emitting diode reflector molding process as claimed in claim 7, wherein the electrode connection circuit is further provided with a conductive connection pad located on a surface of the first green sheet structure, the second green sheet structure, or the base.

12. The light emitting diode reflector molding process as claimed in claim 7, wherein the base is provided with a third opening overlapped with the first opening and containing a metallic admixture.

* * * * *